United States Patent [19]
Abel et al.

[11] Patent Number: 5,057,901
[45] Date of Patent: Oct. 15, 1991

[54] LEAD FRAME FOR SEMI-CONDUCTOR DEVICE

[75] Inventors: Baron E. Abel, Wrightsville; David L. Archer, Harrisburg, both of Pa.

[73] Assignee: Die Tech, Inc., York Haven, Pa.

[21] Appl. No.: 599,262

[22] Filed: Oct. 19, 1990

Related U.S. Application Data

[63] Continuation of Ser. No. 413,192, Sep. 27, 1989, abandoned.

[51] Int. Cl.⁵ .......................................... H01L 23/48
[52] U.S. Cl. ........................................ 357/70; 357/69
[58] Field of Search .................................. 357/70, 69

[56] References Cited

U.S. PATENT DOCUMENTS

| | | | |
|---|---|---|---|
| 4,120,558 | 10/1978 | Seidler | 339/275 |
| 4,214,120 | 7/1980 | Jones, Jr. et al. | 357/70 |
| 4,257,668 | 3/1981 | Ellis | 339/258 |
| 4,357,069 | 11/1982 | Milora | 339/275 |
| 4,367,910 | 1/1983 | Seidler | 339/275 |
| 4,592,617 | 6/1986 | Seidler | 339/275 |
| 4,766,478 | 8/1988 | Dennis | 357/70 |
| 4,782,589 | 11/1988 | Donnis | 29/827 |
| 4,816,427 | 3/1989 | Dennis | 437/309 |

Primary Examiner—Eugene R. LaRoche
Assistant Examiner—R. Ratliff
Attorney, Agent, or Firm—Thomas Hooker

[57] ABSTRACT

A lead frame for orienting and then mounting a plurality of clip leads on a semi-conductor device or substrate and method.

9 Claims, 2 Drawing Sheets

LEAD FRAME FOR SEMI-CONDUCTOR DEVICE

This is a continuation of co-pending application Ser. No. 413,912, filed on Sept. 27, 1989, now abandoned.

FIELD OF THE INVENTION

The invention relates to stamped metal lead frames for receiving and forming electrical connections with semi-conductor devices, typically of the substrate type and to methods for mounting substrates on the individual leads in a lead frame.

DESCRIPTION OF THE PRIOR ART

U.S. Pat. Nos. 4,766,478, 4,782,589 and 4,816,427 disclose lead frames with rows of pivot-mounted leads extending in rows along the sides of a central opening. The leads are pivoted above the plane of the frame and a substrate is freely positioned between open diverging arms located on the ends of the leads. The leads are then pivoted back to the plane of the lead frame to lower the substrate and capture the edges of the substrate within the open arms on the ends of the leads. Subsequently, the upper and lower arms bent together onto the substrate and soldered to pads on the substrate.

U.S. Pat. Nos. 4,766,478, 4,782,589 and 4,816,427 are assigned to Die Tech, Inc., 295 Sipe Road, York Haven, PA 17370, assignee of the present invention.

SUMMARY OF THE INVENTION

The disclosed lead frames includes rows of like leads each extending along one side of the central substrate opening. Each lead includes a resilient two arm clip facing the opening. A semi-conductor device or substrate is mounted on the leads by first pivoting the leads upwardly so that lead in ends of the lower arms of each clip extend into the opening and form a substrate support extending around the circumference of the opening for holding the substrate in aligned position with respect to the clips. The substrate is lowered and the leads are pivoted back to the plane of the lead frame. Initial contact between the upper clip arms and upper corners at the substrate occurs inwardly of contact surfaces on the upper arms. The contacts on the lower arms are moved smoothly onto the substrate. Further lowering of the substrat wipes the contact on both arms along the top and bottom surfaces of the substrate without injury to the contacts or the substrate.

The thickness of the substrate is greater than the minimum width of the clips so that insertion of the substrate into the frame positions the arms on both sides of the substrate and at the same time spreads the arms apart a distance to provide desired contact pressure between the contacts and pads on the substrate. Following insertion, permanent electrical connections, such as solder connections, welded connections and the like, may be formed between the arms and substrate.

Other objects and features of the invention will become apparent as the description proceeds, especially when taken in conjunction with the accompanying drawings illustrating the invention, of which there are 2 sheets and one embodiment.

DESCRIPTION OF THE PREFERRED EMBODIMENT

Figure 1:
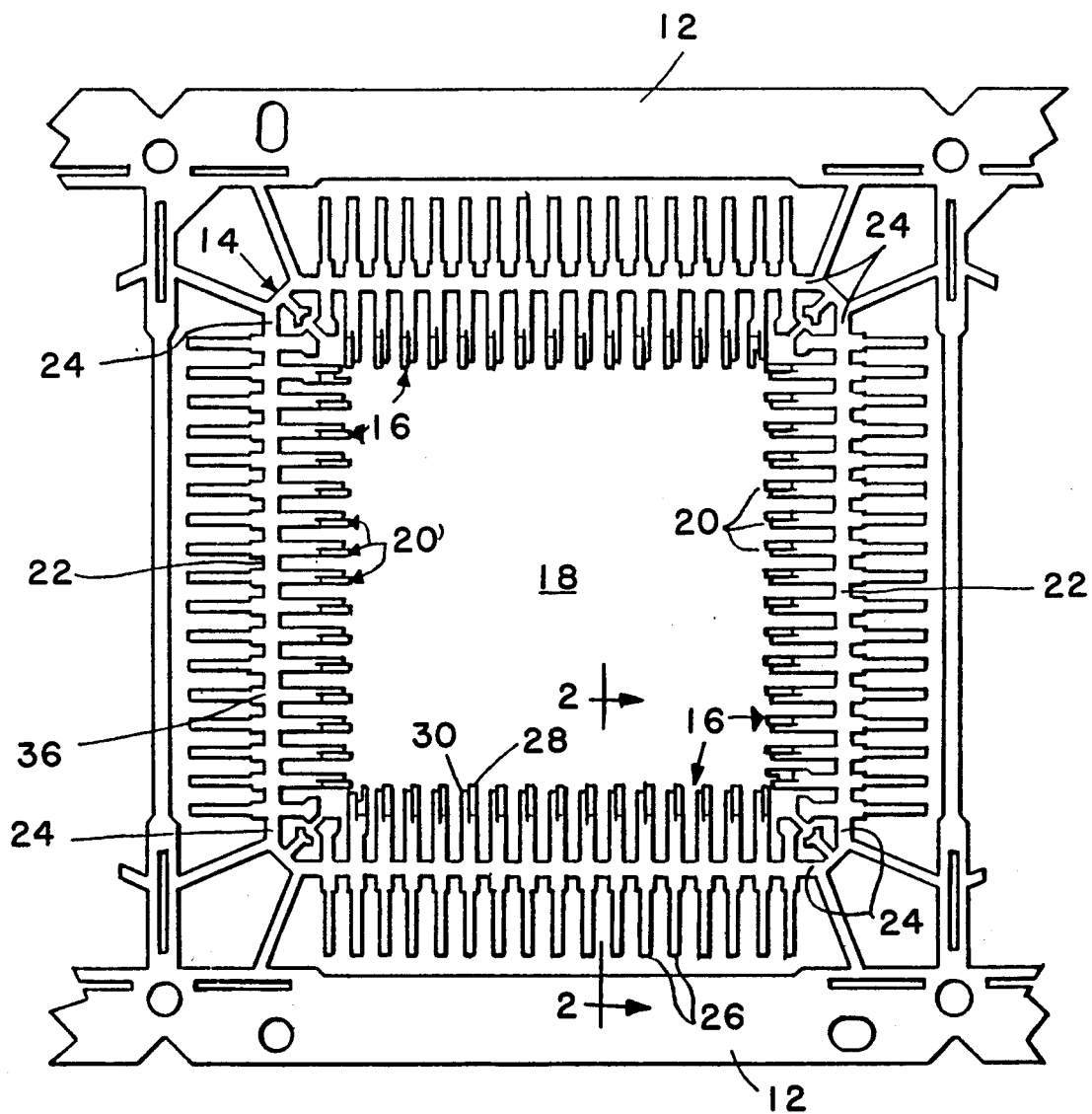
FIG. 1 is a plan view of a continuous stamped, formed lead frame according to the invention.

Lead frame 10 is stamp formed from a uniform thickness metal strip stock and includes a pair of continuous carrier strips 12 on the opposite sides of the lead frame. The strips support a plurality of like frames 14 spaced at regular intervals along the length of the lead frame. Each frame includes four rows 16 of multiple leads defining a central square opening 18. Individual leads 20 in each row facing the opening are supported on continuous mounting strips 22 extending along the sides of the opening. The ends of the mounting strips are connected to the lead frame by hinges 24.

Figure 2:
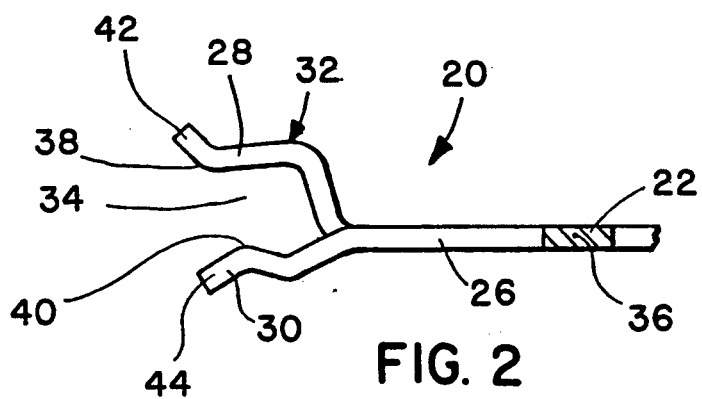
FIG. 2 is an enlarged sectional view showing one lead taken along line 2—2 of FIG. 1.

As shown in FIG. 2, each lead 20 includes an elongate tail 26 extending away from opening 18 and across strip 22 and a pair of contact arms 28 and 30 forming a clip 32 on the end of the lead facing the opening 18. The arms on either side of open clip mouth 34 are formed by splitting the inner ends of tails 26. The lead frame is manufactured with the lead tails 26 in the plane of the lead frame.

As shown in FIG. 2, clip arm 28 includes a convex contact 38 facing mouth 34 and arm 30 includes a convex contact 40 also facing mouth 34. Contact 38 is located further away from the bottom of the clip and nearer the opening 18 than contact 40. The free ends on arms 28 and 30 include lead ins 42 and 44 respectively which extend to either side of the clip and enlarge the open end of mouth 34.

Figure 3:
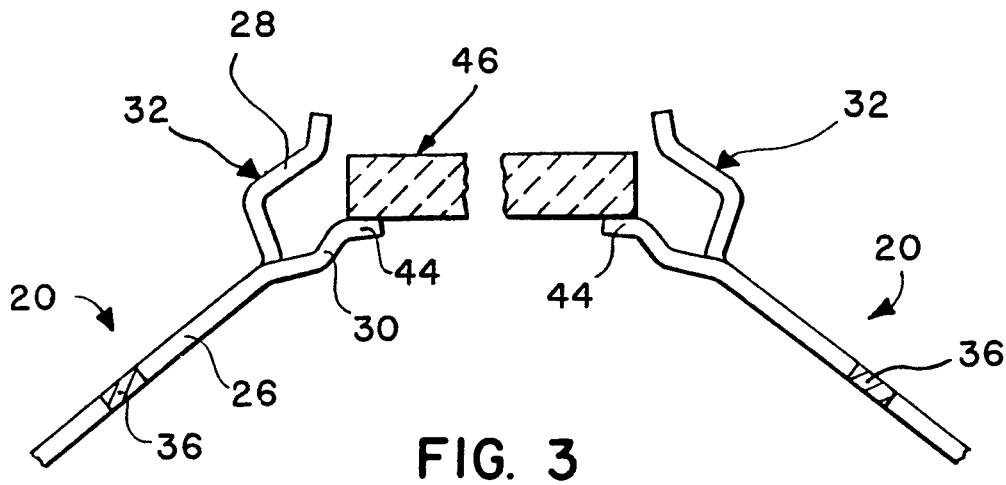
FIGS. 3, 4 and 5 are views showing leads on both sides of the frame in initial insertion, intermediate insertion and final insertion positions during mounting of a substrate in the frame.
Figure 4:
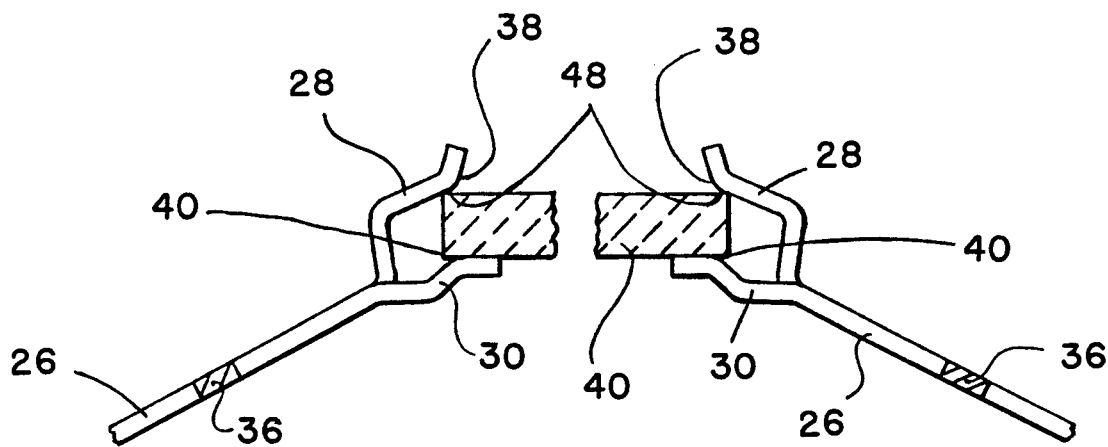
Figure 5:
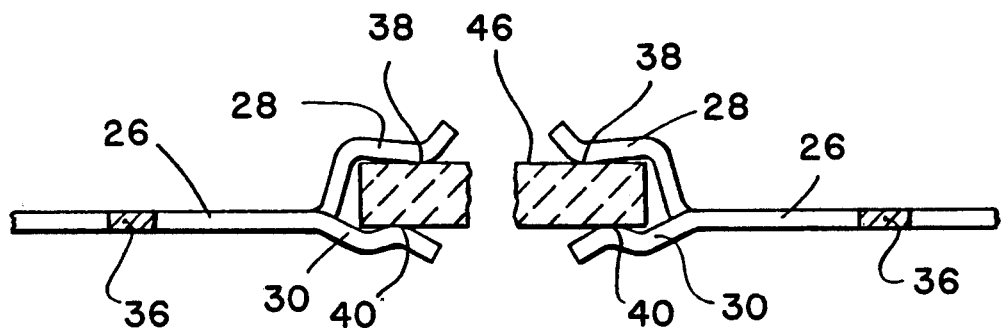

FIGS. 3, 4 and 5 illustrate mounting of a square substrate 46 in frame 14 of lead frame 10. Prior to engagement between the substrate and the individual leads 20 each row of leads is rotated upwardly about axis 36 so that all of the clips 32 face upwardly as shown in FIG. 3 and the lead ins 44 on the ends of lower arms 30 lie essentially in a horizontal plane and define a flat support surface parallel to the lead frame 10 for receiving and initially supporting substrate 46. With the leads bent up as shown, lead ins 44 are located inwardly of the upper arm 28 and permit vertical movement of the substrate down past arms 28 and onto the lead ins 44. The clips extend circumferentially around the opening 18 and confine substrate 46 in a known location within the opening so that contact pads on the substrate (not illustrated) are in proper position for forming electrical connections with leads 20 after the substrate has been lowered into contact position has shown in FIG. 5.

The leads may be rotated to the position of FIG. 3 as desired. For instance, the insertion tooling may include a bar extending along the free ends of lead tails 26 so that lowering of the bars pivots the leads upwardly. Likewise, a bar may be brought into engagement with the underside of the end of the tails adjacent the clips to force the clips upwardly. The tails may be clamped against either bar to assure they are properly positioned for receiving the substrate.

With the substrate in place as shown in FIG. 3, insertion is completed by lowering the substrate and at the same time pivoting the leads 20 back down around axis 36 to the plane of frame 14. FIG. 4 illustrates a position at which the substrate has been lowered sufficiently to move the upper clip arms 28 into contact with the adjacent substrate corners 48. Initial engagement between the upper arms 28 and the substrate corners occurs at a location along the arms inwardly of contacts 38.

In this way, contacts 38 are brought into engagement with the substrate with the top of the substrate without engaging the or hanging up on the corners with risk of injuring both the clip and substrate.

Initial contact between the upper lead arms and the substrate positions the substrate within the opening 18. Continued lowering of the substrate into the opening rotates leads 20 downwardly around axis 36 to achieve the fully inserted position of FIG. 5. During this step, the contacts 38 and 40 are brought into contact with the top and bottom of the substrate and are wiped a distance inwardly along the substrate to form wiped pressure contacts with conductive pads. The width of the substrate is greater than the minimum width of mouth 34 so that the arms are forced apart during loading on the substrate. The stressed clip arms act as springs and bias contacts 38 and 40 against the substrate. Following mounting of the leads on the substrate as described the permanent electrical connections may be formed between the clips and contact pads on the substrate in a conventional manner. For instance, the clip contact arms may be provided with a solder coating or may carry a mass of solder such that heating of the clips melts the solder and forms soldered joints joining the clips to the contact pads.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

What we claim as our invention is:

1. An integral normally flat lead frame for forming connections on opposite sides of a flat substrate; the lead frame including a pair of opposed parallel strips having ends opposite each other; integral strip means for joining the adjacent ends of the strips; a first row of elongate parallel leads integrally joined to one strip by hinge connections and extending toward the other strip and a second row of parallel leads integrally joined to the other strip by hinge connections and extending toward the first strip, the rows of leads being spaced apart to define a central opening; a clip on the end of each lead, each clip including a first arm on one side of the frame and a second arm on the other side of the frame spaced a distance apart from the first arm to define a mouth facing the central opening, each first arm including a free end adjacent the central opening, an initial substrate contact surface and a convex final substrate contact surface with the final substrate contact surface being located between the initial substrate contact surface and the free end of the arm, each second arm including a free end adjacent the central opening, an initial contact surface and a final contact surface with the initial contact surface being located between the free end and the final contact surface; such leads being rotatable relative to the remainder of the frame to position the clips in an initial substrate insertion position on said one side of the frame above the remainder of the frame, an intermediate substrate insertion position located below the initial position and a final substrate insertion position in the plane of the frame so that when in the initial substrate insertion position the clips open upwardly at an angle above the frame and the initial contact surfaces of the second arms in the rows of leads are spaced closer together than the first arms in the rows of leads to permit free movement of a substrate located above the frame down past the first arms and onto the support surfaces of the second arms, when in the intermediate insertion position the initial contact surfaces of the first arms of both rows engage the upper corners of the substrate and the final contact surfaces are free of and above the substrate, and when in the final insertion position the final contact surfaces of both arms engage the top and bottom surfaces of the substrate inwardly of the substrate corners.

2. A frame as in claim 1 wherein said hinge connection comprises a continuous extending integral with and through the leads in each row, and hinges at the ends of strips joining the strips to the frame.

3. A frame as in claim 2 wherein said clips are located side by side across the width of each lead.

4. A lead frame including a continuous carrier strip and a plurality of frames as in claim 1 integrally joined to the carrier strip.

5. A lead frame as in claim 4 wherein each frame includes a second pair of parallel rows of leads like said first pair of parallel rows of leads, said rows of leads being arranged on the sides of a rectangle to define a rectangular central opening.

6. A normally flat lead frame for forming electrical connections with a substrate or the like, the frame including a first pair of spaced apart parallel rows of leads defining a central opening, between the leads, each lead having a clip having an open mouth facing the opening and connection means joining the leads to the frame and permitting rotational movement of the clips above one side of the lead frame, each clip having a first arm on said one side of the frame and a second arm on the other side of the lead frame, the first arm including a first convex contact facing the mouth of the clip and a first lead-in extending from the first contact to the free end of the first arm in a direction outwardly from the mouth of the clip, the second arm including a second convex contact facing the mouth of the clip and a second lead-in extending from the second contact to the free end of the second arm in a direction outwardly from the mouth of the chip, the first contact being located a distance further away from the bottom of the clip than the second contact; said lead frame having (a) a first substrate-receiving position in which the leads are extended above the one side of the lead frame at a first angle so that the clips are separated and the second lead-ins lie in a plane in position to support a substrate above the first side of the lead frame, and the first lead-ins extend generally away from the lead frame the spacing between the first lead-ins in the two rows of leads is greater than the spacing between the second lead-ins in the two rows of leads to permit movement of a substrate past the first lead-ins and onto the second lead-ins, (b) a second initial-contact position in which the leads are extended above the one side of the lead frame at a second angle less than the first angle so that the rows of clips are closer together and nearer to the lead frame than in the first position and the first arms engage the upper corners of a substrate resting on the second arms at locations inwardly of the first contacts, and (c) a third position in which the leads are in the plane of the lead frame and the contacts of both arms are wiped inwardly along and engage the top and bottom surfaces of the substrate.

7. A lead frame as in claim 6 wherein each lead includes a straight tail, said tail having an end extending away from the central opening.

8. A lead frame as in claim 6 wherein said connection means includes a mounting strip extending along each row of leads integral with said tails.

9. A lead frame as in claim 8 including a second pair of spaced apart parallel rows of leads extending along the ends of the central opening perpendicular to said first pair of rows of leads.

* * * * *